United States Patent [19]

Chappell et al.

[11] Patent Number: 5,015,881
[45] Date of Patent: May 14, 1991

[54] HIGH SPEED DECODING CIRCUIT WITH IMPROVED AND GATE

[75] Inventors: Barbara A. Chappell; Terry I. Chappell, both of Amawalk; Stanley E. Schuster, Granite Springs, all of N.Y.

[73] Assignee: International Business Machines Corp., Armonk, N.Y.

[21] Appl. No.: 488,358

[22] Filed: Mar. 2, 1990

[51] Int. Cl.$^5$ ................. H03K 19/017; H03K 19/096; H03K 19/094; H03K 17/04

[52] U.S. Cl. .................................. 307/449; 307/451; 307/471; 307/443; 307/481; 307/594; 307/473

[58] Field of Search ............... 307/443, 448, 450, 451, 307/481, 482, 571, 585, 579, 475, 542, 471, 472, 449, 463, 594; 377/77; 364/716, 717; 371/25.1, 26, 70; 340/784, 803, 146.2

[56] References Cited

U.S. PATENT DOCUMENTS

| | | | |
|---|---|---|---|
| 3,443,122 | 5/1969 | Bowers | 307/205 |
| 3,500,062 | 3/1970 | Annis | 307/216 |
| 3,569,729 | 3/1971 | Washizuka | 307/205 |
| 3,742,248 | 6/1973 | Eaton, Jr. | 307/471 X |
| 3,943,378 | 3/1976 | Beutler | 307/451 X |
| 4,185,209 | 1/1980 | Street | 307/218 |
| 4,233,524 | 11/1980 | Burdick | 307/205 |
| 4,344,005 | 8/1982 | Stewart | 307/463 |
| 4,424,460 | 1/1984 | Best | 307/471 |
| 4,429,374 | 1/1984 | Tanimura | 365/230 |
| 4,511,814 | 4/1985 | Matsuo et al. | 307/572 |
| 4,577,124 | 3/1986 | Kolke | 307/451 |
| 4,590,393 | 5/1986 | Ransom et al. | 307/471 |
| 4,618,784 | 10/1986 | Chappell et al. | 307/449 |
| 4,620,117 | 11/1986 | Fang | 307/451 |
| 4,684,829 | 8/1987 | Uratani | 307/449 |
| 4,791,319 | 12/1988 | Tagami et al. | 307/449 X |
| 4,845,677 | 7/1989 | Chapell et al. | 365/189 |
| 4,893,031 | 1/1990 | Masuda | 307/448 X |
| 4,910,417 | 3/1990 | El Gamal et al. | 307/448 X |

OTHER PUBLICATIONS

Chappell et al., "A 3.5-ns/77K and 6.2-ns/300 K 64K CMOS RAM with ECL Interfaces", IEEE Transactions of Solid-State Circuits, vol. 24, No. 4, Aug. 1989, pp. 859-867.

Griffin et al., "Wired or and and Circuits for CVS and CMOS Logic", IBM Technical Disclosure Bulletin, vol. 27, No. 6, Nov. 1984, pp. 3200-3201.

Gersback et al., "Cascode Decoder", IBM Technical Disclosure Bulletin vol. 8, No. 4, Sep. 1965, pp. 642-643.

*Primary Examiner*—Stanley D. Miller
*Assistant Examiner*—David R. Bertelson
*Attorney, Agent, or Firm*—Perman & Green

[57] ABSTRACT

An AND gate includes first and second opposite-type field effect transistors, each including first and second conduction path terminals and a control electrode. The gate's output terminal is connected, in common, to the second conduction path terminals of the transistors. A first logic input is connected to the first conduction path terminal of the first transistor and a second logic input is connected in common to the control electrode of the first transistor and to the first conduction path terminal of the second transistor. A third logic input is applied to the control electrode of the second transistor. In a standby state prior to the application of logic signals all three logic inputs are in the same state. This assures no conduction of logic signals, while conditioning the gate for rapid selection when logic signals are applied. Subsequently, logic signals are applied to the inputs with the third input being the complement level of the logic signal on the first input. As a result, the circuit's output terminal only provides a high state output if the first and second inputs are in the high state. An erroneous output is avoided in the event of a skew of the inputs due to a clamping acton exerted on the gate's output by the first transistor. A logical decoding circuit using the above described AND circuit enables a one-out-of-32 decode to occur in three stages including a self-contained reset for fast cycle operation.

9 Claims, 3 Drawing Sheets

HIGH SPEED DECODING CIRCUIT WITH IMPROVED AND GATE

FIELD OF THE INVENTION

This invention relates to high speed logic circuits and, more particularly, to a high speed AND gate employing complementary field effect transistors and a decoding circuit which employs such AND circuits.

BACKGROUND OF THE INVENTION

In U.S. Pat. No. 4,845,667 to Chappell et al., assigned to the same assignee as this application, a pipelined memory chip structure is described wherein the chip is partitioned into 32 8K bit subarrays. The structure uses complementary MOS memory cells, each memory cell composed of six devices. To achieve an improvement in cycle times, the memory array employs localized precharge and input triggered, self resetting circuits. The circuits described therein are able to precharge a block of memory quickly after it has performed its function, in anticipation of the next access.

To assure the success of a memory such as described in the '667 Patent, it is necessary to have a decoder which enables one of 32 blocks of memory to be rapidly selected. Tree circuits enable such decoding, but generally operate at speeds which impair the efficient operation of the memory.

Such tree decoders often use AND circuits which employ complementary MOS, field effect transistors. One such logical AND circuit employs a single N channel CMOS device with the two logical inputs, one applied to a conduction path terminal and another to the gate terminal. The output is taken from the other conduction path terminal. That circuit has a speed advantage since the N channel device conducts as soon as the gate input rises. It also provides reliable operation if the input logic voltages are skewed, as both inputs must transition to the high state for the output to go high. However, since the N channel device operates as a source follower, there is a resulting loss in output level due to the drop across the device.

A P channel implementation of the single device AND circuit is also known which employs input signals which transition in opposite directions. The disadvantage of that circuit is that the input logic signals must pass each other in transitioning from the high to the low state and vice-versa, before the device turns on. This results in an unwanted time delay through the circuit.

Instead of applying a transitioning logic signal to the gate of a P channel device, a dc negative conditioning voltage can be applied and the logic signal applied to a conduction path electrode. The disadvantage to this approach is the circuit's sensitivity to a skew of the input signals. In the event it is desired to deselect the P AND circuit, the gate input is raised to render the P channel device nonconductive. However, if the conduction path electrode signal rises before the conditioning potential on the gate rises, a false turn-on can occur.

Accordingly, there exists a need for a high speed AND circuit which will enable rapid decoding of an address for a memory array. Furthermore, there exists a need for a high speed rapid decoding circuit for a memory array to enable optimum operation of the array.

Exemplary prior art indicating CMOS logic circuits can be found in IBM Technical Disclosure Bulletin, Vol. 27 No. 6, Nov. 1984, pages 3200, 3201, and U.S. Pat. No. 3,443,112 to Bowers, Jr., U.S. Pat. No. 3,500,062 to Annis, U.S. Pat. No. 4,185,209 to Street, U.S. Pat. No. 4,233,524 to Burdick, U.S. Pat. No. 4,511,814 to Matsuo et al., U.S. Pat. No. 4,577,124 to Koike, U.S. Pat. No. 4,590,393 to Ransom et al. and U.S. Pat. No. 4,620,117 to Fang.

Representative prior art showing decoding circuits can be found in IBM Technical Disclosure Bulletin, Vol. 8, No. 4, Sept. 1965, pages 642,643, and U.S. Pat. No. 3,344,005 to Stewart, U.S. Pat. No. 4,429,374 to Tanimura, U.S. Pat. No. 4,618,784 to Chappel et al., and U.S. Pat. No. 4,684,829 to Uratani.

Accordingly, it is an object of this invention to provide an improved logical AND circuit.

It is a further object of this invention to provide an improved decoding circuit for high speed memory operation for both access and cycle.

SUMMARY OF THE INVENTION

An AND gate includes first and second opposite-type field effect transistors, each including first and second conduction path terminals and a control electrode. The gate's output terminal is connected, in common, to the second conduction path terminals of the transistors. A first logic input is connected to the first conduction path terminal of the first transistor and a second logic input is connected in common to the control electrode of the first transistor and to the first conduction path terminal of the second transistor. A third logic input is applied to the control electrode of the second transistor. In a standby state prior to the application of logic signals all three logic inputs are in the same state. This assures no conduction of logic signals, while conditioning the gate for rapid selection when logic signals are applied. Subsequently, logic signals are applied to the inputs with the third input being the complement level of the logic signal on the first input. As a result, the circuit's output terminal only provides a high state output if the first and second inputs are in the high state. An erroneous output is avoided in the event of a skew of the inputs due to a clamping action exerted on the gate's output by the first transistor.

A logical decoding circuit using the above described AND circuit enables a one-out-of-32 decode to occur in three stages including a self-contained reset for fast cycle operation.

DETAILED DESCRIPTION OF THE INVENTION

As will be seen, the decoding circuit of this invention is self contained and requires no external signals except address bit inputs. Resetting is done locally and is self timed. The circuit reduces delay by initializing, to a selected state, as many nodes as possible in the critical path. Having the address voltages always transition in a predetermined direction enables higher speed operation. While the decoder circuit of this invention will be described with the addresses in an initial binary logic state, it should be understood that the dual of this circuit is possible with all addresses precharged initially to the other binary logic state. While the circuit is described in a fully pulsed synchronous environment, it should be understood that this circuit could be adapted to an asynchronous or other timing environment.

Figure 1:
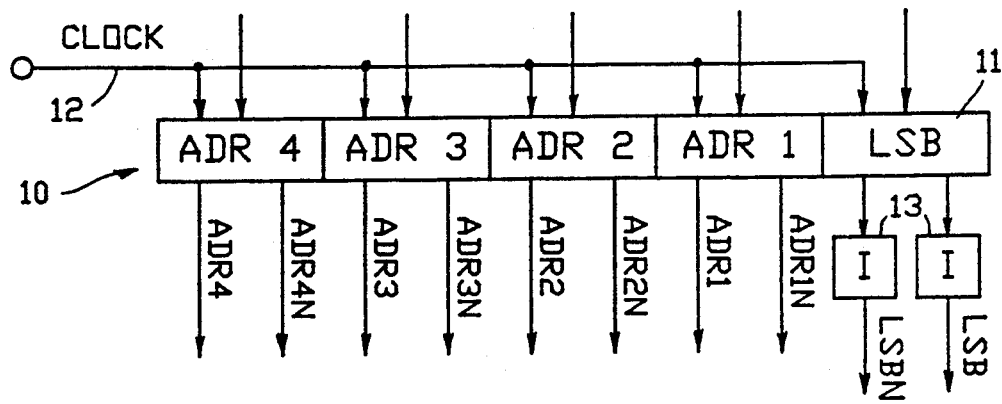
FIG. 1 indicates a five element address buffer which provides both true and complement levels for a five bit address.

In FIG. 1, a five bit address register 10 is schematically illustrated with the address bits indicated therein. The least significant bit, LSB, is stored in the rightmost bit position 11, and address bits ADR1-ADR4 are stored in the remaining 4 positions. Each register stage provides both true and complement output levels indicative of the logic state stored therein, which states are used, selectively, in the operation of the decoding circuit. A clock input 12 is applied to each register stage. When clock input 12 is high, all outputs from address register 10 are clamped to a low logic state (including both true and complement outputs). When clock input 12 traverses to the low logic state, register 10 is enabled to operate in the well-known manner (i.e. exhibiting true and complement outputs indicative of each stage's logical value).

It is to be noted that a pair of inverters 13 invert the clamped level of LSB stage 11 to a high logic state, the purpose of which will become presently apparent. A circuit diagram for a buffer register as shown in FIG. 1 can be found in Chappell et al., "A 3.5 ns/77K and 6.2 ns/300K 64K CMOS RAM with ECL Interfaces", IEEE Journal of Solid State Circuits, Vol. 24, No. 4, August 1989, pp. 859-868 (see FIG. 5).

Figure 2:
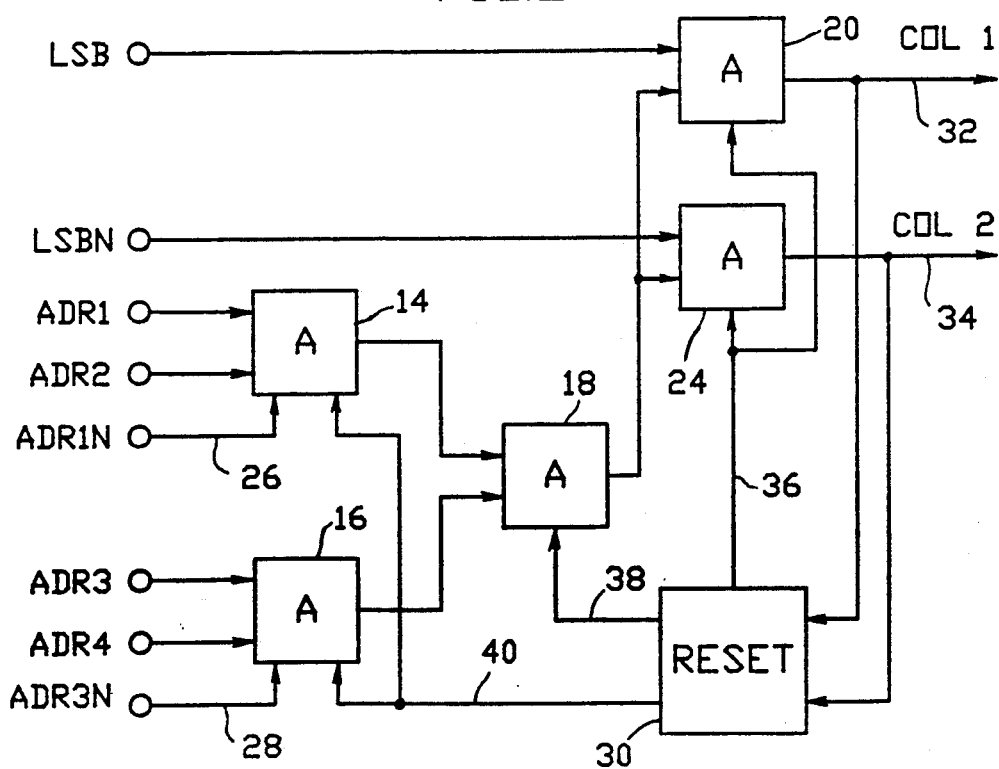
FIG. 2 is a block diagram of the decoding circuit of this invention.

Turning now to FIG. 2, a portion of a 1 out of 32 decoding circuit is shown which enables the selection of either of two outputs, depending upon the state of the LSB bit in the address buffer. To accomplish a 1 out of 32 selection, the circuit shown in FIG. 2 is repeated 16 times, with unique address connections for each circuit. As will be seen, 4 address bits and 2 complements, plus a true and complement of the LSB bit, serve as inputs and enable selection of one or the other of a pair of column outputs, from any one of the 16 circuits.

The decode circuits of this invention operate through three separate phases, i.e. Standby, Active and Reset. The Standby phase is operative until a clock input transitions from a high state to a low state and the true and complement address bits are gated from the address register to the decode circuit. The Active phase follows automatically as does the subsequent Reset phase. At the conclusion of the Reset phase, the circuit's cycle is complete and new address bits can be accepted.

During Standby, the outputs from buffer register 10 are clamped to a low state as described above. The LSB and LSB complement (LSBN) lines exhibit high state outputs while the remaining true and complement address lines all exhibit low states.

The first stage of the decode circuit includes a pair of special AND gates 14 and 16 whose outputs are applied to AND gate 18. The output of AND gate 18 is applied to a pair of AND gates 20 and 24, respectively. AND gate 14 provides the logical AND function for the ADR 1 and ADR2 address bits, whereas AND gate 16 provides the same function for the ADR3 and ADR4 address bits. AND circuit 14 is provided with an input line 26, to which is applied the ADR1N level (the complement of the ADR1). AND circuit 16 has a similar input line 28 to which is provided ADR3N (the complement of the ADR3 level). It should be noted that FIG. 2 is an example of one of the sixteen decoders, each of which has a unique combination of address connections.

The Reset phase of the decode circuit is enabled by Reset circuit 30 sensing a high state on either of output lines 32 or 34. In such a case, Reset circuit 30 provides timed reset potentials via conductors 36, 38 and 40 to devices which enable a fast return to the Standby state, as will be hereinafter described.

In operation, each of AND gates 14 and 16 provides a high state output to AND gate 18 only when their respective address bit inputs are in the high state (i.e. ADR1-ADR4 are all high in the example of FIG. 2). Under those conditions, AND gate 18 provides an enabling input to AND gates 20 and 24 to enable them to respectively respond to the state of the LSB input and to correspondingly energize one or the other of output lines 32 or 34.

It will be seen from the detailed description of the circuit diagram in FIG. 5 below, that conditioning lines 26 and 28 to AND gates 14 and 16 enable their rapid response to input address bits. In addition, the initial high state levels on the LSB and LSBN input lines (during Standby phase) enable capacitances associated with those lines to be precharged. This results in a faster operation of AND gates 20 or 24, when one is subsequently selected. At the end of the Standby phase, either the LSB or LSBN line falls to the low state in accordance with the logical output of LSB stage 11 in address register 10 to deselect one of the two outputs.

Figure 3:
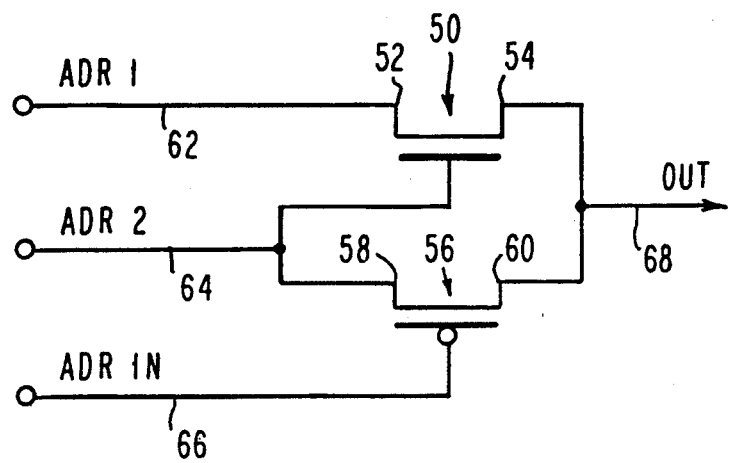
FIG. 3 is a circuit diagram of an improved AND circuit employed with the decoder of FIG. 2.
Figure 4:
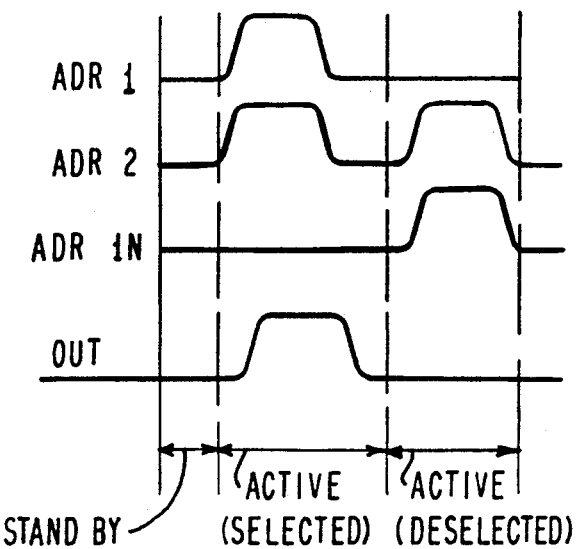
FIG. 4 is a set of waveform diagrams helpful in understanding the operation of FIG. 3.

Referring now to FIG. 3, a diagram is shown of a circuit used to implement AND gates 14 and 16. MOS device 50 is an N-channel field effect transistor having a pair of conduction path terminals 52 and 54. MOS device 56 is a P-channel field effect transistor having a pair of conduction path terminals 58 and 60. The circuit shown in FIG. 3 provides an AND function for signals appearing on input lines 62 and 64. FIG. 4 provides an indication of the waveforms applied to the circuit of FIG. 3 during both the Standby and Active states. If the circuit is "not selected", either or both ADR1 and ADR2 will be low during the Active part of the cycle and its output will remain low.

During the Standby phase, input lines 62 and 64 and 66 (see FIG. 3) are clamped to the low state. For the selected case, the low levels on lines 62, 64, and 66 condition devices 50 and 56 for rapid operation upon the subsequent application of logic levels. When the logic states on lines 62 and 64 simultaneously rise, N-channel device 50 conducts heavily. Additionally, the application of a high state to input line 64 causes terminal 5 to rise and results in conduction through P-channel device 56 (assuming that ADR1N stays low). As a result, a dual action occurs. Device 56 conducts as soon as input line 64 starts to rise, causing output line 68 to rise to the level of line 64, without line 66 changing state. In other words, the Standby state of line 66 equals its active state every time there is an AND condition on inputs 62 and 64. At the same time, the input level on line 64 causes device 50 to conduct and to pull the level of output line 68 up to the level of input line 62.

The deselected state occurs if either or both of lines 62 or 64 remains in the low state, output line 68 sees no high state. For instance, (see FIG. 4) if line 62 (ADR1) is in the low state, its complement (ADR1N)) on line 66 will be in the high state and will bias device 56 to nonconduction. Under these conditions, the state of line 64 does not affect output line 68.

The circuit also prevents false turn-ons when the input signals become skewed. For instance, if the level on line 64 traverses to the high state and line 62 remains in the low state, a false turn-on might occur if the level on line 66 is delayed in its traversal from the low to the high state (to evidence the complement of the level on line 62). However, the high state on line 64 turns on device 50 and causes output line 68 to be clamped to the low level on line 62, notwithstanding the possible turn-on of device 56. This action is further assured if the conduction channel of device 50 is made sufficiently large with respect to the width to length ratio of the conduction channel in device 56 to "sink" the current from a false turn-on of device 56.

Thus, the parallel combination of semiconductor devices 50 and 56 enables a high speed logical AND function to be accomplished with an early turn on of N-channel device 50 and a good high level from P channel device 56, both aiding in establishing a valid AND output signal on line 68.

Figure 5:
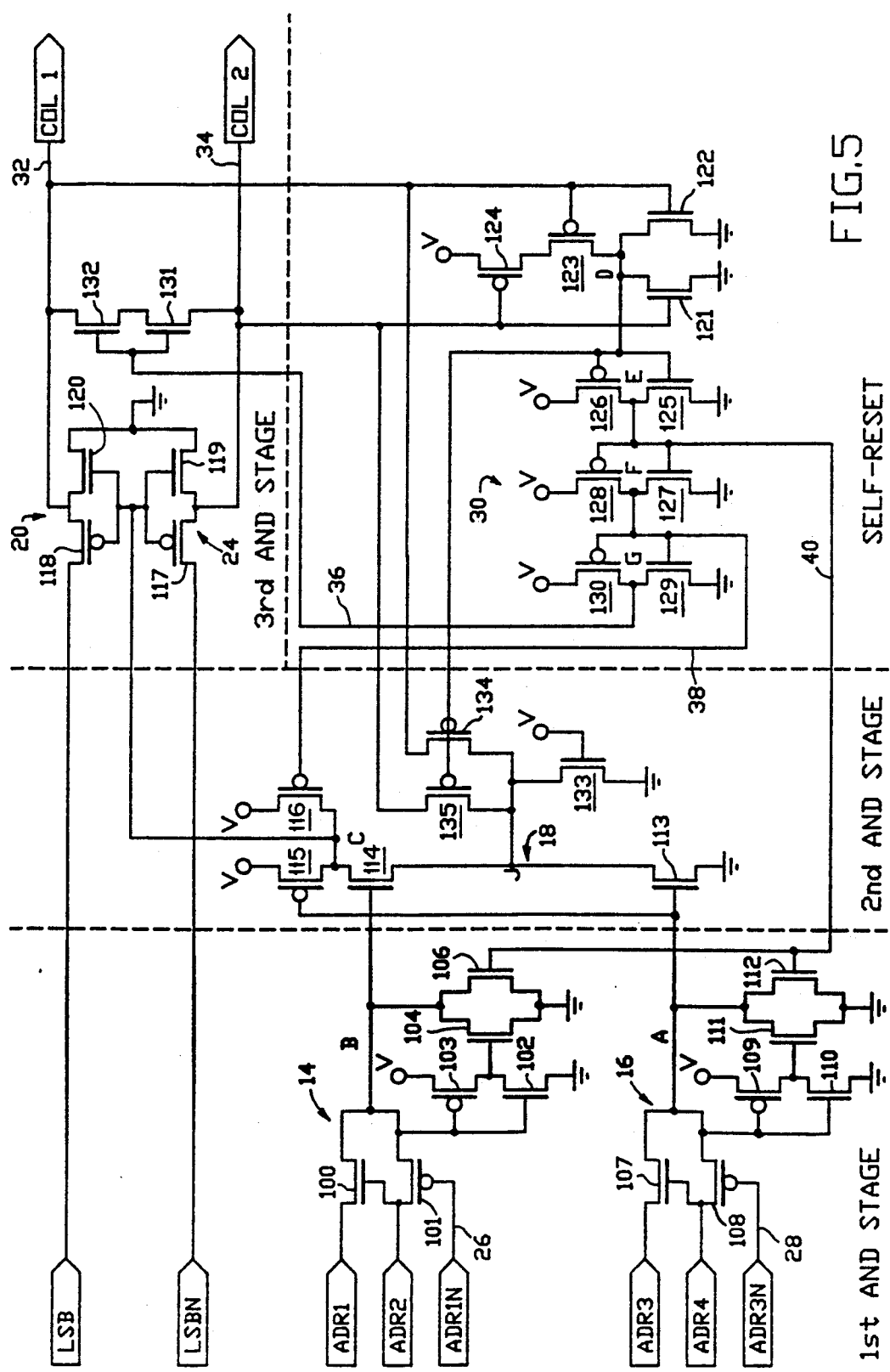
FIG. 5 is a detailed circuit diagram of the block diagram of FIG. 2.

Turning now to FIG. 5, a detailed circuit diagram is illustrated of the decoding circuit of FIG. 2. Initially, it will be remembered that during the Standby phase, the LSB and LSBN lines exhibit a high state, and the ADR-1-ADR4 and ADR1N and ADR3N are clamped to the low state. At the commencement of the Active phase, it is assumed for this example that ADR1-ADR4 all assume a high state. Also, for this example, it will be assumed that the LSB input stays at the high state whereas the LSBN input traverses to the low state.

The ADR1 and ADR2 high state inputs cause devices 100 and 101 to conduct and thereby cause a high state to be applied to line B. Likewise, the ADR3 and ADR4 high states cause the devices 107 and 108 to conduct thereby causing the level at node A to rise to the high state. Devices 102, 103, 104, as well as devices 109-111 are employed during the Standby phase to clamp lines A and B. Devices 106 and 112 act as reset circuits for AND gates 14 and 16. These circuits will be described below, however for now, it is sufficient to point out that when ADR2 traverses from a low state to a high state, device 103 becomes nonconductive and device 102 conducts, thereby causing device 104 to become nonconductive. Device 106 is also nonconductive due to a feedback level from reset circuit 30, so node B is seen to be solely influenced by the levels on ADR1 and ADR2. In AND circuit 16, devices 109-112 operate in a similar manner.

When both nodes A and B rise, devices 113 and 114 conduct and cause node C to transition towards ground. The high state on node A additionally causes device 115 to become nonconductive. (Device 116 is maintained nonconductive due to a feedback from reset circuit 30.) As a result, node C drops and conditions devices 117 and 118 for conduction. Due to the complementary levels on LSB and LSBN, only one of devices 117 or 118 conducts. In this case, since LSB is assumed to be at the high state, device 118 conducts and line 32 is caused to traverse to the high state. For the time being, devices 119 and 120 are biased to the nonconduction state by node C and devices 131 and 132 to nonconduction by reset circuit 30.

As soon as output line 32 or 34 rises, reset circuit 30 is enabled. Since line 32 has risen to the high state, device 123 becomes nonconductive and device 122 conducts. Should line 34 traverse to the high state, device 124 becomes nonconductive and device 121 becomes conductive-as the case may be. Either of these cases causes the level at node D to fall. When node D falls, device 126 conducts and device 125 becomes nonconductive, thereby causing node E to rise. The rise at node E, via line 40, causes devices 106 and 112 to become conductive, thereby clamping nodes A and B to ground.

It should be parenthetically noted that node D is also connected to devices 134 and 135 which, in combination with device 133 act to assure that node J does not capacitively undershoot during the operation of the circuit. Further device 133 keeps node J low in the standby state which speed selection. Devices 133, 134 and 135 have small width to length ratio conduction channels and do not materially effect the logic state of output line 32 or 34.

As nodes A and B are clamped through the action of devices 106 and 112, the high state at node E causes device 127 to conduct and device 128 to become nonconductive, thereby causing the level at node F to fall to ground. The potential fall at node F is applied to device 116 which conducts and causes the voltage at node C to rise towards the supply level V. That rise biases devices 117 and 118 to nonconduction and devices 119 and 120 to conduction. However, since devices 119 and 120 have small width to length ratio conduction channels, they merely start the discharge of output lines 32 and 34.

The final Reset action occurs when the low level at node F causes device 130 to become conductive and device 129 nonconductive. This action causes the gates of devices 131 and 132 to rise, thereby clamping both output lines 32 and 34 to ground. The clamp levels on both lines 32 and 34 force reset circuit 30 to condition the remaining portions of the circuit of FIG. 5 to the standby state, thereby readying the circuit for the next cycle of operation.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

We claim:

1. An AND gate comprising:
   first and second opposite type field effect transistors, each said transistor including first and second conduction path terminals and a control electrode;
   an output terminal connected in common to said second conduction path terminals of said first and second transistors;
   a first logic input connected to said first conduction path terminal of said first transistor;
   a second logic input connected in common to said control electrode of said first transistor and to said first conduction path terminal of said second transistor;
   a third input connected to said control electrode of said second transistor;
   means for applying to said first, second and third inputs, a Standby conditioning potential which renders said transistors into a potentially conductive state; and
   means for applying logic signals to said first and second inputs and a complement of the logic signal on said first input to said third input, whereby both said transistors may be rendered conductive by simultaneously applied logic signals of one type to said first and second logic inputs, to thereby cause said output terminal to reflect a logical AND.

2. The AND gate of claim 1 wherein said first transistor is a field effect device having an N-channel, and said second transistor is a field effect device having a P-channel.

3. The AND gate of claim 1 wherein said first transistor has a higher current carrying capacity than said second transistor.

4. A decoding circuit comprising:
first and second AND gates, each said AND gate having at least three inputs, two for receiving logic signals and a third for receiving a complement of one said input;
a third AND gate responsive to AND state outputs from said first and second AND gates to provide a gating output;
fourth and fifth AND gates, each having as one input, said gating output from said third AND gate and, as another input, a logic signal, one of said fourth and fifth AND gates having the true state of said logic signal applied and the other having the complement state of said logic signal applied; and
circuit means for applying Standby logic level signals to said inputs to said first and second AND gates which prepare said AND gates for rapid operation and for applying Standby logic level signals to inputs to said fourth and fifth AND gates to precharge said inputs in preparation for receiving logic signals.

5. The decoding circuit as defined in claim 4 wherein said Standby logic level signals applied to said first and second AND gates exhibit a first logic level, and said Standby logic level signals applied to said fourth and fifth AND gates exhibit a second logic level.

6. The decoding circuit as defined in claim 4 further comprising:
reset means responsive to a logical AND output from said fourth or fifth AND gate, to force each of said first through fifth AND gates to produce outputs identical to those produced when said standby logic level signals are applied by said circuit means.

7. The decoding circuit as defined in claim 6, wherein said reset means includes a logic level control circuit connected to the output of each said AND gate, said logic level control circuits operationally responsive to an AND state output from either said fourth or fifth AND gate.

8. The decoding circuit defined in claim 7 further comprising:
clock means for enabling said circuit means to cause said third inputs to said first and second AND gates to reflect a complement level of a logic signal applied to one of said two logic signal inputs to said first and second AND gates, and to enable said another input to said fourth and fifth AND gates to reflect the true and complement levels of a logic signal input state.

9. The decoding circuit defined in claim 6 wherein said first and second AND gates comprise:
first and second opposite type field effect transistors, each said transistor including first and second conduction path terminals and a control electrode;
an output terminal connected in common to said second conduction path terminals of said first and second transistors;
a first logic input connected to said first conduction path terminal of said first transistor;
a second logic input connected in common to said control electrode of said first transistor and to said first conduction path terminal of said second transistor; and
a third input connected to said control electrode of said second transistor.

* * * * *